| United States Patent [19] | [11] Patent Number: 4,974,056 |
|---|---|
| Brodsky et al. | [45] Date of Patent: Nov. 27, 1990 |

[54] STACKED METAL SILICIDE GATE STRUCTURE WITH BARRIER

[75] Inventors: Stephen B. Brodsky, Valley Cottage, N.Y.; Dan Moy, Bethel, Conn.; Rajiv V. Joshi, Yorktown Heights, N.Y.

[73] Assignee: International Business Machines Corporation, Armonk, N.Y.

[21] Appl. No.: 52,825

[22] Filed: May 22, 1987

[51] Int. Cl.⁵ .................. H01L 29/62; H01L 29/78
[52] U.S. Cl. ............................. 357/71; 357/23.1
[58] Field of Search ....................... 357/71, 715, 68

[56] References Cited

U.S. PATENT DOCUMENTS

| 3,573,570 | 4/1971 | Fuller et al. | 357/71 |
|---|---|---|---|
| 3,614,547 | 10/1971 | May | 357/71 |
| 3,633,076 | 1/1972 | Heinz-Herbert et al. | 357/71 |
| 4,263,058 | 4/1981 | Brown | 148/6 |
| 4,276,557 | 6/1981 | Levinstein | 357/67 |
| 4,445,134 | 4/1984 | Miller | 357/71 |
| 4,470,189 | 9/1984 | Roberts | 29/571 |
| 4,584,207 | 4/1986 | Wilson | 427/124 |

FOREIGN PATENT DOCUMENTS

| 0097833 | 11/1984 | European Pat. Off. | 357/71 |
|---|---|---|---|
| 57-201072 | 12/1982 | Japan | 357/71 |
| 59-98968 | 6/1983 | Japan | 357/71 |
| 59-3978 | 1/1984 | Japan | 357/71 |

OTHER PUBLICATIONS

J. Cuomo, Selective-Chemical Vapor Deposition of Tungsten, 1972, pp. 270-291, 3d Int'l Conference of Chemical Paper Deposition, American Nuclear Society Proceedings.

*Primary Examiner*—Gene M. Munson
*Attorney, Agent, or Firm*—Blaney Harper; Jeffrey S. LaBaw; John D. Crane

[57] ABSTRACT

A gate structure for integrated circuit devices which includes a work function layer, a low resistivity layer, and an electrically conductive barrier layer between the two other layers to prevent the other two layers from intermixing. The work function controlling layer is preferably selected from the group of tungsten, molybdenum, their silicides, or a combination thereof.

6 Claims, 1 Drawing Sheet

STACKED METAL SILICIDE GATE STRUCTURE WITH BARRIER

BACKGROUND OF THE INVENTION

This invention relates to the chemical vapor deposition of metal and silicide films on a substrate. More particularly, it relates to a structure of stacked metal and silicide films useful for gate contacts in semiconductor devices.

In the development of VLSI technology, there is a continuous trend to reduce the dimensions of the integrated circuit devices to increase the speed of the devices. As the density of these devices is increased, the resistance of the interconnecting lines and gate contacts must be reduced. In both bipolar and FET devices, polysilicon has long been used as the material for the conducting layer closest to the epitaxial film. However, its relatively high resistivity in high density integrated circuits has led to a search to develop alternate materials for gate contacts.

Among the properties desired in a gate contact material are low resistivity, suitable work function, good adhesion, low stress (particularly on oxide), and process compatibility. No single material possesses all the desired properties.

Work function of a material is defined as the minimum energy necessary for an electron to escape into vacuum from an initial energy level equal to the Fermi level. By selecting the proper work function by choice of materials, the threshold voltage of the device can be adjusted without the need for channel implantation in n-channel or p-channel devices. Omitting channel implantation avoids inferior buried channel operation in PMOS and simultaneously yields high mobility and transconductance in NMOS.

Tungsten and its silicide ($WSi_x$) are potential candidates because of their suitable work function. They also possess good adhesion, low stress on oxide, and relatively low resistivities. $WSi_x$ forms good quality silicon dioxide passivation layers or sidewall spacers when thermally oxidized, when x is greater than 2.5. However, $WSi_x$, despite being 10 times lower in sheet resistance than polysilicon, has higher resistivity than many silicides capable of being used in the CMOS processes.

Titanium disilicide ($TiSi_2$), for example, has a much lower resistivity than $WSi_x$. $TiSi_2$ can also be deposited via CVD, unlike other metal silicides with low resistance, such as cobalt disilicide. It does not, however, have the suitable work function and temperature stability required when deposited on oxide.

The desire to combine the desirable properties of potential gate materials has led some researchers to stack layers of the respective materials on one another to form a composite. In the IBM technical disclosure bulletin, "Modified Salicide- Single Gate Electrode for CMOS FET Applications", Vol. 27 No. 8, January 1985, a thin layer of tungsten or molybdenum silicide is covered by a thicker layer of titanium silicide to form the gate electrode. This structure suffers from the intermixing of the titanium silicide and tungsten silicide layers. The intermixing causes substantial increases in resistivity. Also, titanium can diffuse through the thin layer of tungsten silicide into the underlying oxide and destroy the device by causing leakage through the insulated gate.

SUMMARY OF THE INVENTION

Therefore, it is an object of the present invention to combine in a gate structure the desirable properties of a work function controlling layer, such as tungsten, and a low resistivity layer, such as titanium disilicide, in an improved manner.

It is another object of this invention to prevent the work function controlling layer and the low resistivity later of the the gate structure from intermixing.

These and other objects will be apparent from the detailed description which follows.

The present invention accomplishes these goals in a gate structure where the first layer is a high work function layer, the last layer is a low resistivity layer and the intermediate layer is an electrically conducting barrier to the mixing of the other two layers. This invention will be defined in greater detail by referring to the attached drawings and the description of the preferred embodiments.

DESCRIPTION OF THE PREFERRED EMBODIMENTS

Figure 1:
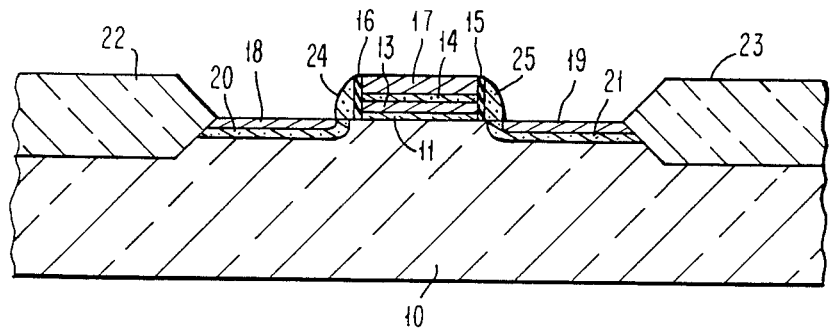
FIG. 1 is a cross-section view of a gate electrode structure built according to a first embodiment of the present invention.

Referring now to FIG. 1, a gate structure built in accordance with the present invention is shown. In FIG. 1, a thin gate oxide layer 11 is deposited on the gate area of substrate 10 to separate the gate structure from the semiconductor device. A tungsten silicide layer 13 is then deposited. A layer of polycrystalline silicon 14 is superposed on top of the tungsten silicide layer 13 and the entire gate contact stack is topped by a titanium disilicide layer 17. In the structure in FIG. 1, tungsten silicide 13 is the work function controlling layer, polysilicon 14 is the barrier layer, and titanium silicide 17 is the low resistivity layer. Thermal oxide sidewalls 15, 16 and a nitride cap 24, 25 serve to insulate the vertical sides of the gate contact stack 13, 14, and 17. Additional areas of titanium disilicide 18, 19 provide the contact areas for the source and drain. Other isolation areas shown in FIG. 1 are the field regions of 4000 angstroms silicon dioxide 22, 23 and the nitride layers 20, 21.

Figure 2:
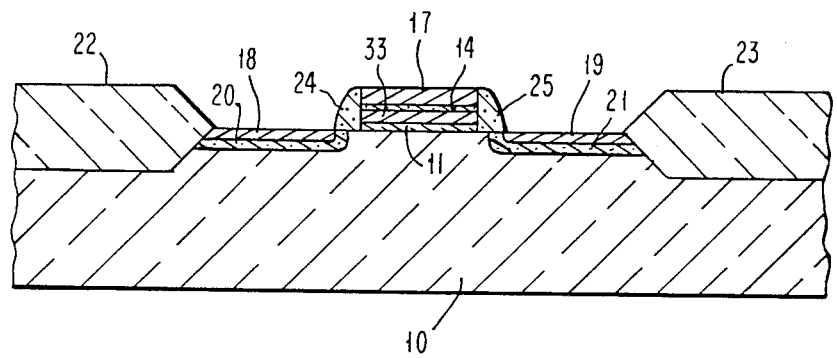
FIG. 2 is a cross-section view of a gate electrode structure built according to a second embodiment of the present invention.

In FIG. 2, a gate structure built in accordance with a second embodiment of the invention is shown. In FIG. 2, a layer of tungsten containing a minor phase of $W_5Si_3$ 33 is deposited by low pressure chemical vapor deposition (CVD) on the gate oxide 11. The silicon 14 and titanium silicide 17 layers are substantially the same as in the structure in FIG. 1. In this structure, the tungsten-tungsten silicide composite 33 is the work function controlling layer, polysilicon 14 is the barrier layer and titanium silicide 17, the low resistivity layer. No thermal oxide sidewalls are grown due to the relative lack of silicon in the tungsten layer.

The following process steps describe one preferred method of building the structure shown in FIG. 1:

After the gate oxide 11 has been defined by prior processing, disilane ($Si_2H_6$ (500–1500 sccm) and $WF_6$ (10 sccm) are allowed to flow over the wafer in an CVD reactor until 150–200 Angstroms of silicon rich tungsten silicide 13 (WSi$_x$; ×2.5) is deposited directly on the gate oxide 11. The deposition temperature is 350-450 degrees Centigrade. WSi$_x$ deposition is followed by an in-situ disilane flow (300-500 sccm) in plasma mode for approximately 200 seconds. This will result in an 1200-1500 Angstroms amorphous silicon film 14 on top of the tungsten silicide 13. The in-situ process is important to guarantee a clean interface between the tungsten silicide 13 and amorphous silicon 14. The structure is then annealed at high temperature to convert the amorphous silicon 14 and WSi$_x$ 13 to a polycrystalline form. The polysilicon may be doped depending on the desired device characteristics. A nitride cap is deposited on top of the tungsten silicide/polysilicon structure.

The structure is etched in CF$_4$+O$_2$ plasma to oxide level creating a gate structure. The structure is oxidized to form thermal oxide sidewalls 15, 16 and then source and drain are ion implanted. Using lithography, the nitride spacers 24, 25 are created by reactive ion etching. A titanium layer 300-750 Angstroms can be used to form a self-aligned titanium silicide layer 17 using a diffusion reaction process. Titanium will react with the silicon, but not the dielectric areas 22, 23 surrounding the device. The thickness of titanium should be carefully controlled so as to leave only 50 to 100 Angstroms of unreacted silicon to provide the barrier layer. The ideal resulting structure is shown in FIG. 1.

The structure in FIG. 2 is produced when a layer 33 of tungsten containing a minor phase of W$_5$Si$_3$ is formed to replace the WSi$_x$ film 13 in FIG. 1. This is best accomplished in a low pressure CVD reactor. First, disilane is passed through the CVD reactor in plasma mode. This results in a layer of amorphous silicon of approximately 600 Angstroms in thickness. Tungsten hexafluoride is passed over the silicon converting it to tungsten. This is then followed by a second amorphous silicon deposition of 1500 Angstroms. The remaining processing closely follows that described above for the structure in FIG. 1.

The polysilicon barrier layer should be kept as thin as possible, yet still prevent the work function layer and the low resistivity layer from intermixing. The polysilicon should be kept thin to avoid increasing the overall resistivity of the gate stack. A barrier of 50 to 100 angstroms of polysilicon appears to be optimum.

A refractory metal nitride such as titanium nitride or tungsten nitride may be used as the intermediate barrier layer. It is important to use a barrier layer which is both process compatible and electrically conductive. However, if a refractory metal nitride is used, a silicon film must still be deposited for titanium disilicide formation. The silicon film would be 50 to 100 Angstroms thinner than the embodiments in FIGS. 1 and 2, since no unreacted silicon would be required to form the barrier layer.

Although the above discussion has been directed to the use of tungsten, tungsten silicide and titanium disilicide, other materials may be used. For example, molybdenum and its silicide could substitute for tungsten because of their suitable work function. Also, cobalt disilicide could be used as the low resistivity layer.

While the invention has been described with respect to the particular embodiments above, it would be understood by those skilled in the art that modifications may be made without departing from the spirit and scope of the present invention. It would be possible to fabricate the structures described in the specification using sputtering processes rather than the preferred chemical vapor deposition processes. However, this would create interface and impurity problems avoided by CVD. These embodiments are for purposes of example and illustration only and are not to be taken to limit the scope of the invention narrower than the scope of the appended claims.

We claim:

1. A gate structure comprising:
   a work function controlling material layer to control the threshold voltage of the gate disposed in an insulated spaced relationship with a semiconductor substrate,
   a low resistivity metal layer disposed over said work function controlling layer, and
   a third electrically conducting layer of material selected from the group consisting of silicon or metal nitrides interposed between said work function controlling layer and said low resistivity metal silicide layer to prevent intermixing of said work function controlling layer and said low resistivity metal silicide layer.

2. A gate structure as recited in claim 1 where said work function controlling layer is chosen from the group of molybdenum silicide, tungsten silicide or a composite of tungsten and its silicide.

3. A gate structure as recited in claim 1 wherein said low resistivity metal silicide layer is titanium disilicide or cobalt disilicide.

4. A gate structure disposed on an insulated gate comprising:
   a work function controlling material layer to control the threshold voltage of the gate having first and second essentially parallel surfaces the first of said surfaces contacting the insulated gate,
   a low resistivity metal silicide layer disposed over said work function controlling layer, having first and second essentially parallel surfaces, the second of said surfaces exposed, and
   a third electrically conducting layer of material selected from the group of silicon or refractory metal nitrides between said work function controlling material layer and said low resistivity metal silicide layer, having first and second essentially parallel surfaces, and having the minimum thickness necessary to prevent intermixing between said work function controlling material layer and said low resistivity metal silicide layer, said first surface contacting said second surface of said work function controlling material layer and said second surface contacting said first surface of said low resistivity metal silicide layer.

5. A gate structure as recited in claim 4 wherein:
   said work function controlling material is chosen from the group of molybdenum silicide, tungsten silicide or a composite of tungsten and its silicide,
   said low resistivity metal silicide layer is chosen from the group of titanium disilicide or cobalt disilicide.

6. A gate structure as recited in claim 4 wherein the thickness of said third electrically conducting layer is in the range of 50 to 100 angstroms.

* * * * *

UNITED STATES PATENT AND TRADEMARK OFFICE
CERTIFICATE OF CORRECTION

PATENT NO. : 4,974,056

DATED : November 27, 1990

INVENTOR(S) : Stephen B. Brodsky, Dan Moy and Rajiv V. Joshi

It is certified that error appears in the above-identified patent and that said Letters Patent is hereby corrected as shown below:

Column 4
Claim 1, line 17    After "metal" insert --silicide--.
Claim 2, line 26    Delete "where" and insert therefor --wherein--.

Signed and Sealed this

Twenty-sixth Day of May, 1992

Attest:

DOUGLAS B. COMER

*Attesting Officer*     Acting Commissioner of Patents and Trademarks